United States Patent
Chiu et al.

(10) Patent No.: US 10,068,844 B2
(45) Date of Patent: Sep. 4, 2018

(54) INTEGRATED FAN-OUT STRUCTURE AND METHOD OF FORMING

(71) Applicant: Taiwan Semiconductor Manufacturing Company, Ltd., Hsin-Chu (TW)

(72) Inventors: Ming-Yen Chiu, Zhubei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/871,593

(22) Filed: Sep. 30, 2015

(65) Prior Publication Data

US 2017/0092581 A1  Mar. 30, 2017

(51) Int. Cl.

| | |
|---|---|
| *H01L 23/48* | (2006.01) |
| *H01L 23/52* | (2006.01) |
| *H01L 29/40* | (2006.01) |
| *H01L 21/44* | (2006.01) |
| *H01L 23/522* | (2006.01) |
| *H01L 21/56* | (2006.01) |
| *H01L 21/768* | (2006.01) |
| *H01L 23/31* | (2006.01) |
| *H01L 23/528* | (2006.01) |
| *H01L 25/065* | (2006.01) |
| *H01L 23/538* | (2006.01) |
| *H01L 23/498* | (2006.01) |

(52) U.S. Cl.
CPC ........ *H01L 23/5226* (2013.01); *H01L 21/565* (2013.01); *H01L 21/768* (2013.01); *H01L 21/76802* (2013.01); *H01L 21/76877* (2013.01); *H01L 23/3128* (2013.01); *H01L 23/49822* (2013.01); *H01L 23/49827* (2013.01); *H01L 23/528* (2013.01); *H01L 23/5389* (2013.01); *H01L 25/0657* (2013.01); *H01L 23/49816* (2013.01); *H01L 2224/04105* (2013.01); *H01L 2224/12105* (2013.01); *H01L 2224/18* (2013.01); *H01L 2224/32225* (2013.01); *H01L 2224/48091* (2013.01); *H01L 2224/48227* (2013.01); *H01L 2224/73267* (2013.01); *H01L 2224/92244* (2013.01); *H01L 2225/06548* (2013.01); *H01L 2924/181* (2013.01); *H01L 2924/35121* (2013.01)

(58) Field of Classification Search
CPC . H01L 2224/05551; H01L 2224/05552; H01L 2924/35121; H01L 23/5226; H01L 23/528; H01L 2225/06548
USPC ... 257/737, 773, 774, 786, E23.02, E23.011; 438/612, 614
See application file for complete search history.

(56) References Cited

U.S. PATENT DOCUMENTS

| | | | |
|---|---|---|---|
| 8,361,842 B2 | 1/2013 | Yu et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |

(Continued)

*Primary Examiner* — Fernando L Toledo
*Assistant Examiner* — Aaron Gray
(74) *Attorney, Agent, or Firm* — Slater Matsil, LLP

(57) ABSTRACT

A semiconductor device includes a molding compound and a through via extending through the molding compound. A via connection is disposed over the through via and a cap is disposed over the via connection. A plurality of holes are formed in a section of the cap.

20 Claims, 18 Drawing Sheets

(56) References Cited

U.S. PATENT DOCUMENTS

| | | |
|---|---|---|
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2004/0177999 A1* | 9/2004 | Saiki ................ H01L 23/49816 174/263 |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0077356 A1* | 3/2014 | Chen ................ H01L 23/3192 257/737 |
| 2014/0131858 A1* | 5/2014 | Pan ................ H01L 24/19 257/737 |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0108635 A1* | 4/2015 | Liang ................ H01L 28/10 257/737 |
| 2016/0284639 A1* | 9/2016 | Chen ................ H01L 23/525 |
| 2016/0351499 A1* | 12/2016 | Kitada ................ H01L 23/5283 |

\* cited by examiner

INTEGRATED FAN-OUT STRUCTURE AND METHOD OF FORMING

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
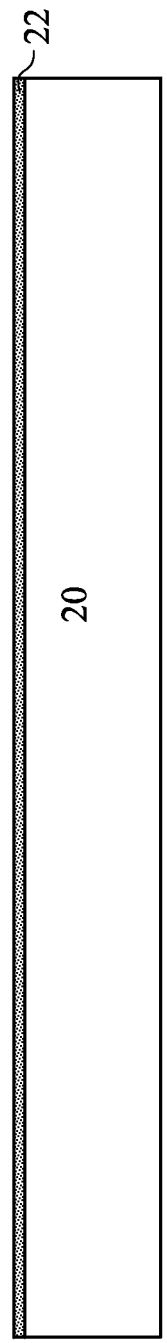
FIGS. 1 through 10 are cross-sectional views of intermediate stages in the manufacturing of a Through Via (TV) package in accordance with some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out ("InFO") package including capped through vias and methods of forming the same are provided in accordance with various exemplary embodiments. The intermediate stages of forming the InFO package are illustrated and variations of embodiments are discussed.

FIGS. 1-10 illustrate cross-sectional views of intermediate steps in forming a semiconductor package in accordance with some embodiments. Referring first to FIG. 1, there is shown a carrier substrate 20 having a release layer 22 formed thereon. Generally, the carrier substrate 20 provides temporary mechanical and structural support during subsequent processing steps. The carrier substrate 20 may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate 20 is planar in order to accommodate further processing.

The release layer 22 is an optional layer formed over the carrier substrate 20 that may allow easier removal of the carrier substrate 20. As explained in greater detail below, various layers and devices will be placed over the carrier substrate 20, after which the carrier substrate 20 may be removed. The optional release layer 22 aids in the removal of the carrier substrate 20, reducing damage to the structures formed over the carrier substrate 20. The release layer 22 may be formed of a polymer-based material. In some embodiments, the release layer 22 is an epoxy-based thermal release material, which loses its adhesive property when heated, such as a Light-to-Heat-Conversion (LTHC) release coating. In other embodiments, the release layer 22 may be an ultra-violet (UV) glue, which loses its adhesive property when exposed to UV light. The release layer 22 may be dispensed as a liquid and cured. In other embodiments, the release layer 22 may be a laminate film laminated onto the carrier substrate 20. Other release layers may be utilized.

Figure 2:
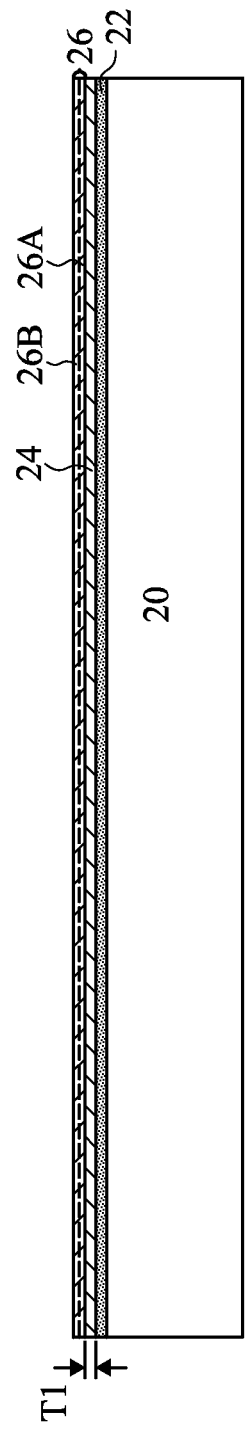

Referring to FIG. 2, buffer layer 24 is formed over release layer 22. Buffer layer 24 is a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, buffer layer 24 is a planar layer having a uniform thickness, wherein the thickness T1 may be between about 2 μm and about 6 μm. The top and the bottom surfaces of buffer layer 24 are also planar.

Referring now to FIGS. 2 to 6, there is shown formation of through vias ("TVs") 33 (see FIG. 6) in accordance with some embodiments. The through vias 33 provide an electrical connection from one side of the package to another side of the package. For example, as will be explained in greater detail below, a die will be mounted to the buffer layer 24 and a molding compound will be formed around the through vias and the die. Subsequently, another device, such as another die, package, substrate, or the like, may be attached to the die and the molding compound. The through vias 33 provide an electrical connection between the another device and the backside of the package without having to pass electrical signals through the die mounted to the buffer layer 24.

The through vias 33 may be formed, for example, by forming a conductive seed layer 26 over the buffer layer 24, as shown in FIG. 2. In some embodiments, seed layer 26 is a metal layer, which may be a single layer or a composite layer comprising a plurality of sub-layers formed of different materials. Seed layer 26 may be made of copper, titanium, nickel, gold, or a combination thereof, or the like. In some embodiments, seed layer 26 comprises a titanium layer and a copper layer over the titanium layer. Seed layer 26 may be formed using, for example, physical vapor deposition (PVD), CVD, atomic layer deposition (ALD), a combination thereof, or the like. In some embodiments, seed layer 26 comprises titanium layer 26A and copper layer 26B over titanium layer 26A. In alternative embodiments, seed layer 26 is a copper layer.

Figure 3:
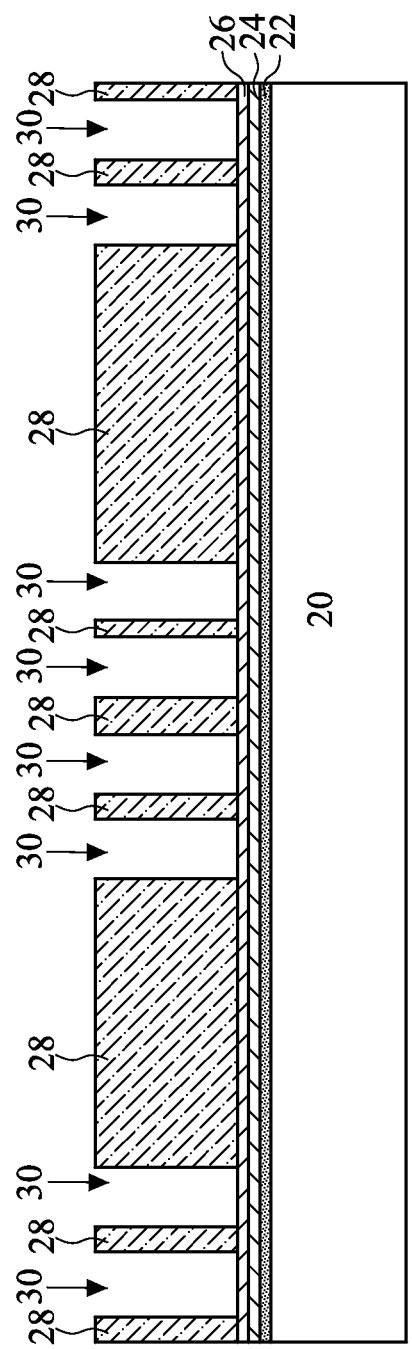
Figure 4:
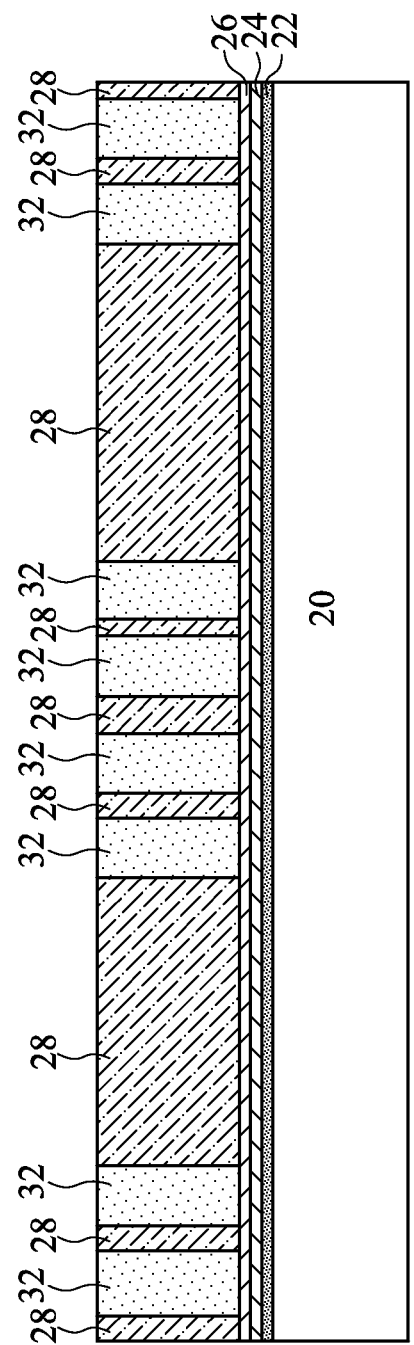

Turning to FIG. 3, a mask layer, such as patterned photoresist layer 28, may be deposited and patterned, wherein openings 30 in the mask layer expose the seed layer 26. Referring to FIG. 4, openings 30 may be filled with a conductive material using, for example, an electroless plating process or an electrochemical plating process, thereby creating metal features 32. The plating process may uni-directionally fill openings (e.g., from seed layer 26 upwards) in the patterned photoresist layer 28. Uni-directional filling may allow for more uniform filling of such openings. Alternatively, another seed layer may be formed on sidewalls of openings 30 in the patterned photoresist layer 28, and such openings may be filled multi-directionally. Metal features 32 may comprise copper, aluminum, tungsten, nickel, solder, or alloys thereof. The top-view shapes of metal features 32 may be rectangles, squares, circles, or the like. The heights of metal features 32 are determined by the thickness of the subsequently placed dies 34 (shown in FIG. 7), with the heights of metal features 32 greater than the thickness of dies 34 in some embodiments.

Figure 5:
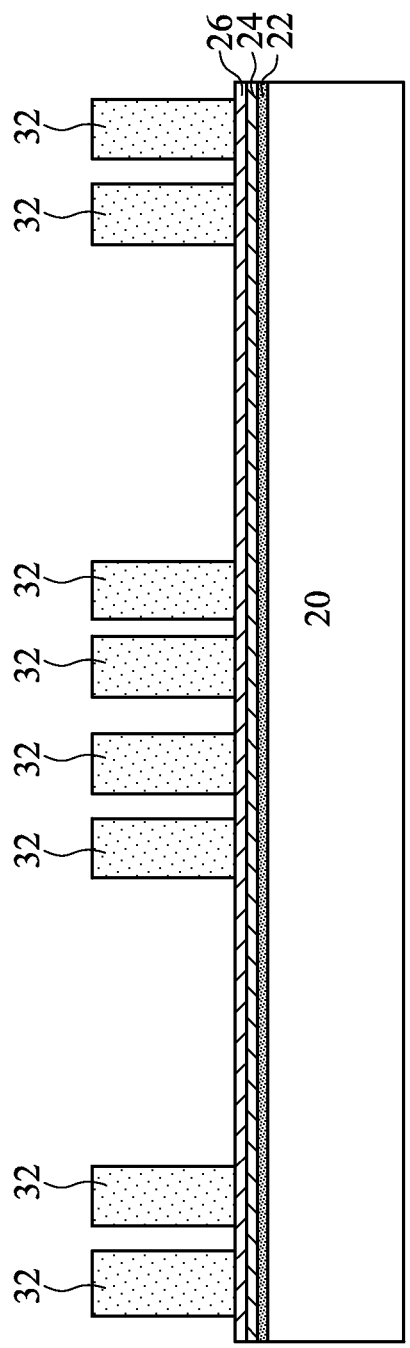
Figure 6:
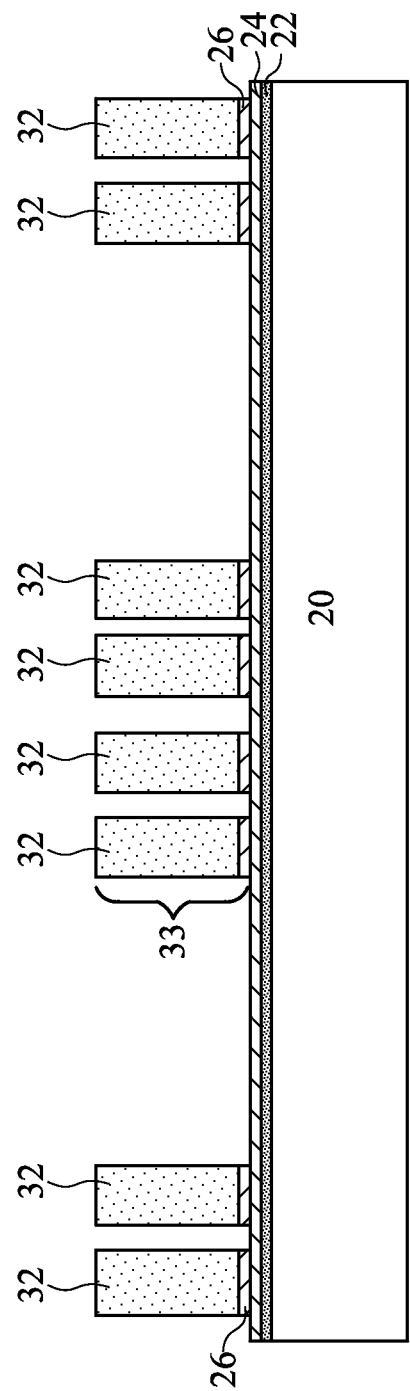

Next, the mask layer may be removed, for example in an ashing and/or wet strip process, as shown in FIG. 5. Referring to FIG. 6, an etch step is performed to remove the exposed portions of seed layer 26, wherein the etching may be an anisotropic etching. The portions of seed layer 26 that are overlapped by metal features 32, on the other hand, remain not etched. Metal features 32 and the remaining underlying portions of seed layer 26 form through vias 33. Although seed layer 26 is shown as a layer separate from metal features 32, when seed layer 26 is formed of a material similar to or the same as the respective overlying metal features 32, seed layer 26 may be merged with metal features 32 with no distinguishable interface between. In some embodiments, there exist distinguishable interfaces between seed layer 26 and the overlying metal features 32. The through vias 33 can also be realized with metal wire studs placed by a wire bonding process, such as a copper wire bonding process. The use of a wire bonding process may eliminate the need for depositing seed layer 26, depositing and patterning mask layer 28, and plating to form the through vias 33.

Figure 7:
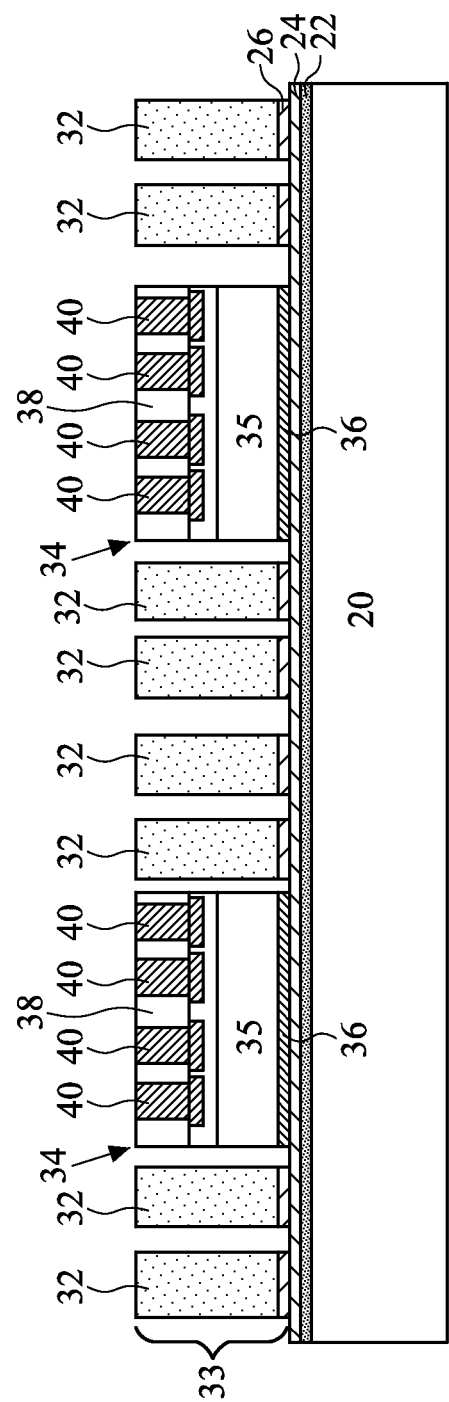

FIG. 7 illustrates attaching an integrated circuit die 34 to the backside of buffer layer 24 in accordance with some embodiments. In some embodiments, the integrated circuit die 34 may be adhered to buffer layer 24 by an adhesive layer 36, such as a die-attach film (DAF). A thickness of the adhesive layer 36 may be in a range from about 5 μm to about 50 μm, such as about 10 um. The integrated circuit die 34 may be a single die as illustrated in FIG. 7, or in some embodiments, two or more than two dies may be attached, and may include any die suitable for a particular approach. For example, the integrated circuit die 34 may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. The integrated circuit die 34 may be attached to a suitable location for a particular design or application. For example, FIG. 7 illustrates an embodiment in which the integrated circuit die 34 is mounted in a center region wherein the through vias 33 are positioned around a perimeter. In other embodiments, the integrated circuit die 34 may be offset from a center. Before being attached to the buffer layer 24, the integrated circuit die 34 may be processed according to applicable manufacturing processes to form integrated circuits in the integrated circuit die 34. Each of dies 34 may include a substrate 35 (a silicon substrate, for example) that is coupled to an adhesive layer, wherein the back surface of semiconductor substrate 35 is coupled to the adhesive layer.

In some exemplary embodiments, the dies 34 include metal pillars 40 (such as copper posts) that are electrically coupled to devices such as transistors (not shown) in dies 34. In some embodiments, dielectric layer 38 is formed at the top surface of the respective die 34, with metal pillars 40 having at least lower portions in dielectric layer 38. The top surfaces of metal pillars 40 may also be level with the top surfaces of dielectric layer 38 in some embodiments. Alternatively, dielectric layer 38 is not formed, and metal pillars 40 protrude above a top layer of the respective dies 34.

Figure 8:
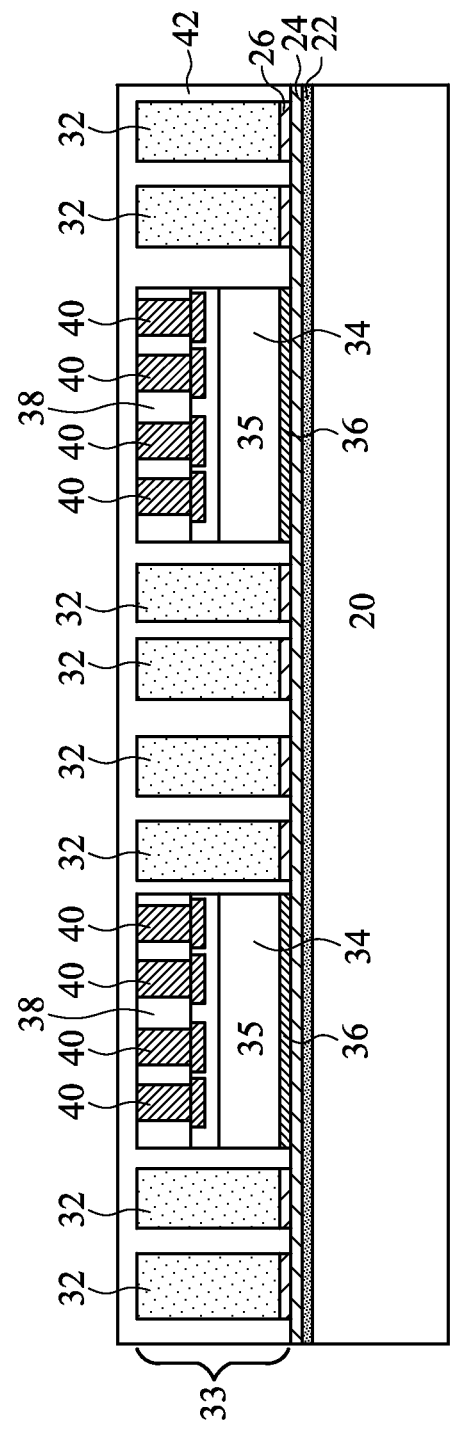

Referring to FIG. 8, molding material 42 is molded on dies 34 and TVs 33. Molding material 42 fills the gaps between dies 34 and TVs 33, and may be in contact with buffer layer 24. Furthermore, molding material 42 is filled into the gaps between metal pillars 40 when metal pillars 40 are protruding metal pillars. Molding material 42 may include a molding compound, a molding underfill, an epoxy, or a resin. The top surface of molding material 42 is higher than the top ends of metal pillars 40 and TVs 33.

Figure 9:
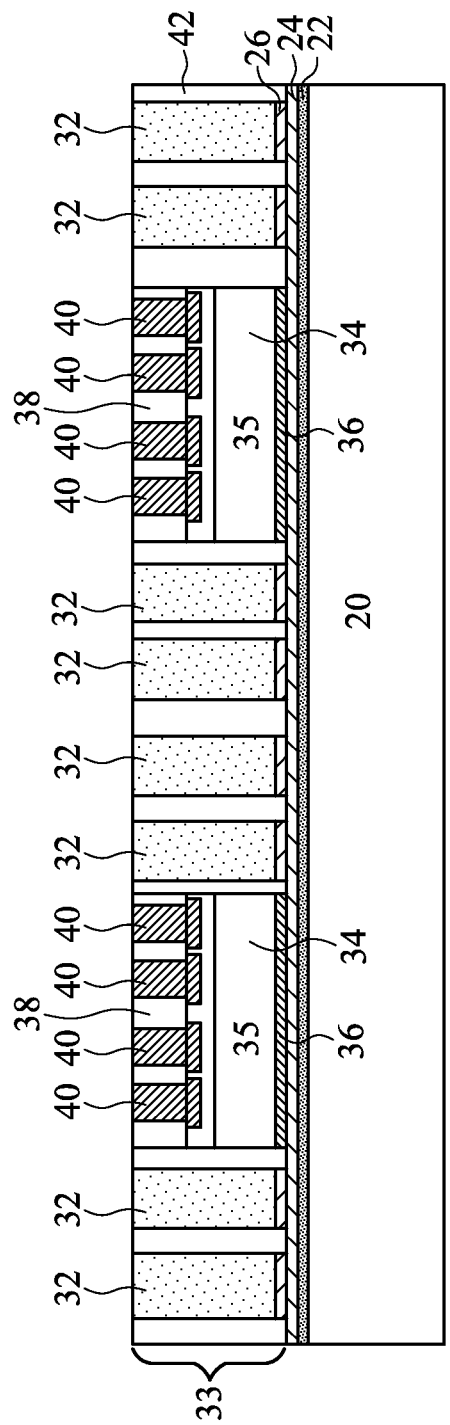

Next, a grinding step is performed to thin molding material 42, until metal pillars 40 and TVs 33 are exposed. The resulting structure is shown in FIG. 9. Due to the grinding, the top ends of metal features 32 are substantially level (coplanar) with the top ends of metal pillars 40, and are substantially level (coplanar) with the top surface of molding material 42. As a result of the grinding, metal residues such as metal particles may be generated, and left on the top surfaces. Accordingly, after the grinding, a cleaning may be performed, for example, through a wet etching, so that the metal residue is removed.

Figure 10:
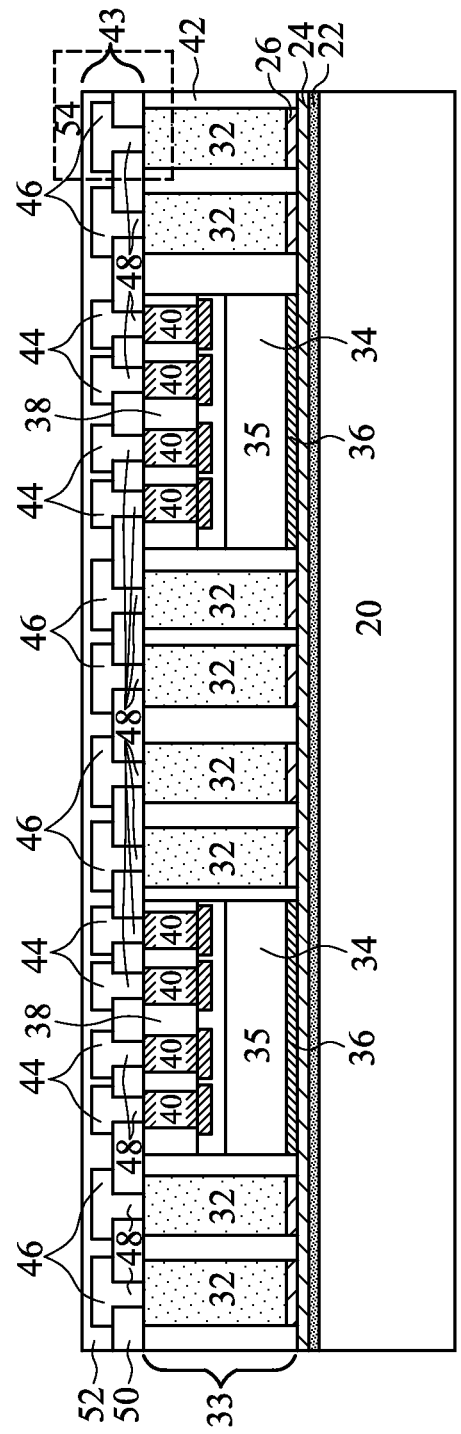

Next, referring to FIG. 10, one or more redistribution layers (RDLs) 43 are formed. Generally, RDLs provide a conductive pattern that allows a pin-out contact pattern for a completed package different than the pattern of through vias 33 and/or metal pillars 40, allowing for greater flexibility in the placement of through vias 33 and dies 34. The RDLs may be utilized to provide an external electrical connection to dies 34 and/or to through vias 33. The RDLs may further be used to electrically couple dies 34 to through vias 33, which may be electrically coupled to one or more other packages, package substrates, components, the like, or a combination thereof. The RDLs comprise conductive lines 44 and via connections 48, wherein via connections 48 connect an overlying line (e.g., an overlying conductive lines 44) to an underlying conductive feature (e.g., through vias 33, metal pillars 40, and/or conductive lines 44). For purposes of illustration, conductive lines 44 are shown as extending into and out of the page. In other embodiments, the conductive lines 44 may extend along any direction.

As illustrated in FIG. 10, the RDLs also include conductive caps 46 placed over the through vias 33 in accordance with some embodiments. As explained in greater detail below, the conductive caps are formed such that a metal density of the cap is reduced, for example by forming holes or other openings in the conductive cap 46. It is believed that a reduction in metal density of the conductive caps 46 according to the embodiments described herein will increase the reliability of the package, particularly during thermal cycling. For example, the conductive caps 46 have large dimensions. The large dimensions induce stresses at the interfaces between the conductive caps 46 and dielectric layer 52, in which the conductive cap 46 is disposed. The stresses on the interfaces may induce peeling of the dielectric material at the interfaces, particularly but not limited to in the vertical direction. The peeling may eventually create cracks in surrounding metal connections and lead to a reduction in reliability, particularly during thermal cycling. It is believed that a reduction in metal density of the conductive caps 46 according to the embodiments described herein will decrease the stresses on the interfaces between the conductive cap and the dielectric layers in which the conductive caps 46 are disposed and thereby increase the reliability of the package, particularly during thermal cycling.

The RDLs may be formed using any suitable process. For example, in some embodiments, dielectric layer 50 is formed on the molding material 42 and integrated circuit die 34. In some embodiments, dielectric layer 50 is formed of a polymer, which may be a photo-sensitive material such as polybenzoxazole (PBO), polyimide, benzocyclobutene (BCB), or the like, that may be patterned using lithography. In other embodiments, dielectric layer 50 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 50 may be formed by spin coating, lamination, CVD, the like, or a combination thereof. Dielectric layer 50 is then patterned to form openings to expose metal pillars 40 and the through vias 33. In embodiments in which dielectric layer 50 is formed of a photo-sensitive material, the patterning may be performed by exposing dielectric layer 50 in accordance with a desired pattern and developed to remove the unwanted material, thereby exposing metal pillars 40 and the through vias 33. Other methods, such as using a patterned mask and etching, may also be used to pattern dielectric layer 50.

A seed layer (not shown) is formed over dielectric layer 50 and in the openings formed in dielectric layer 50. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern, such as the pattern illustrated in FIG. 10. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive caps 46, conductive lines 44 and via connections 48. Dielectric layer 52 is formed over dielectric layer 50 to provide a more planar surface for subsequent layers and may be formed using similar materials and processes as used to form dielectric layer 50. In some embodiments, dielectric layer 52 is formed of polymer, a nitride, an oxide, or the like. In some embodiments, dielectric layer 52 is PBO formed by a spin-on process.

Figure 11:
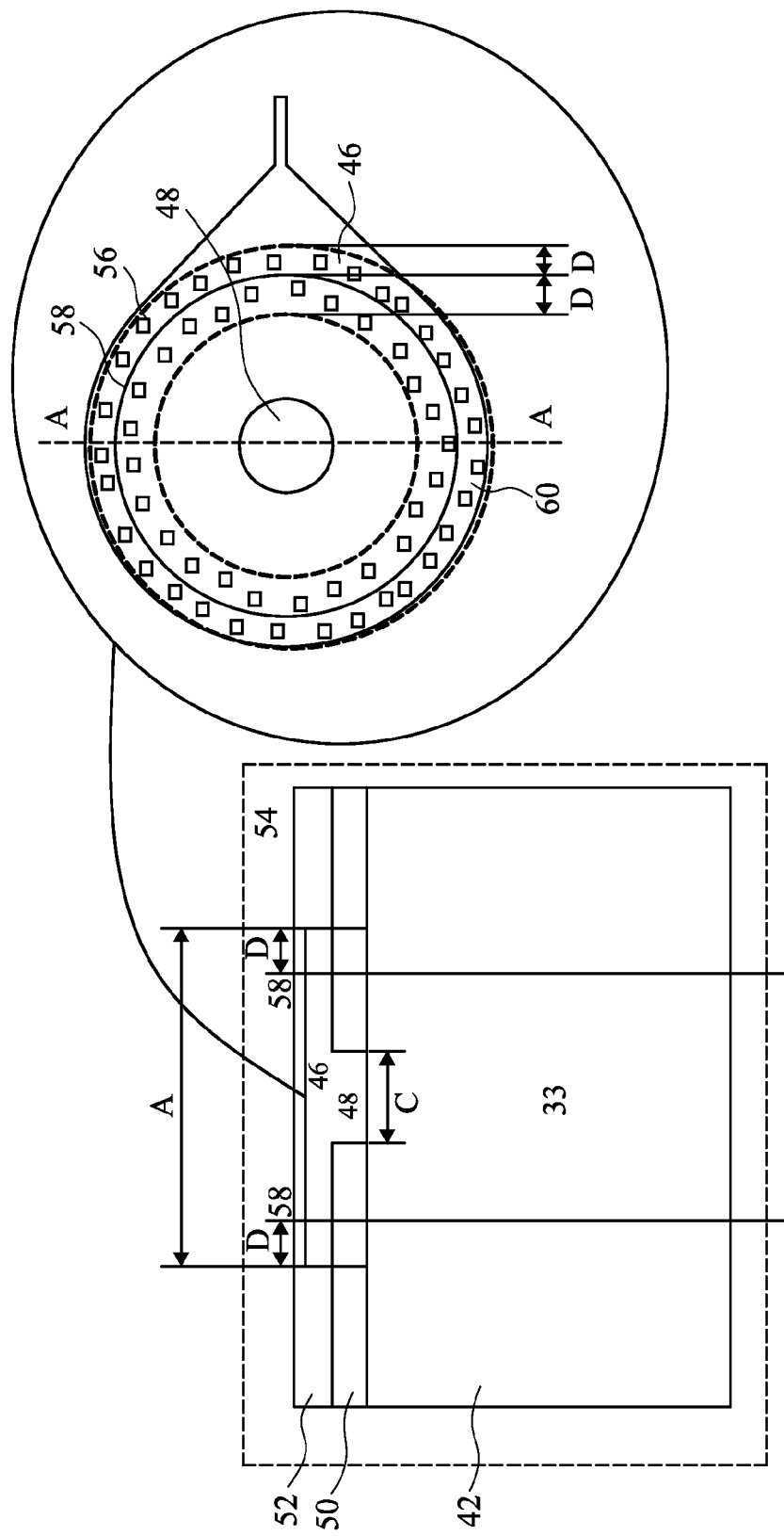
FIG. 11 illustrates a conductive cap formed over a through via in accordance with an exemplary embodiment.

FIG. 11 shows box 54 of FIG. 10 in greater detail. In particular, an enlarged cross section and a corresponding plan view of a conductive cap 46 is depicted, wherein the cross section is taken along the A-A line of the plan view. As discussed above, the cap is formed such that a metal density of the cap is reduced, which may help to reduce stresses on the interface between the conductive cap 46 and the dielectric layer 52 in which the conductive cap 46 is disposed, thereby increasing reliability of the package. Accordingly, conductive cap 46 is formed with a section 60 (outlined by dotted lines in the plan view of conductive cap 46 of FIG. 11), including a plurality of holes in the section 60, resulting in a lower metal density of conductive cap 46 than would have occurred absent the plurality of holes 56.

In some embodiments, conductive cap 46 is disposed over TV 33 and has a width A that is greater than the width B of TV 33. In some embodiments, width A is about 10 µm to about 50 µm greater than width B. Width B, in turn, is between about 100 to about 300 µm. Conductive cap 46 is further disposed over and contacting via connection 48, which electrically couples conductive cap 46 to TV 33. In some embodiments, via connection 48 has a width C which is between about 10 to about 150 µm. In some embodiments, via connection 48 may be merged with conductive cap 46 and there may or may not be a distinguishable interface between conductive cap 46 and via connection 48.

Conductive cap 46 has a section 60 which is depicted using the dotted lines of the plan view of FIG. 11. In some embodiments, section 60 forms a ring disposed over the perimeter 58 of TV 33. In some embodiments, section 60 extends a distance D on either side of the perimeter 58 of TV 33. In some embodiments, distance D is about 5 μm to about 25 μm. Section 60 has a plurality of holes 56, about 10 μm to about 50 μm in width. Holes 56 create a lower metal density in section 60 compared to what the density of conductive cap 46 would have been without holes 56. The reduced metal density of cap 46 created by holes 56 may help to reduce the stresses on the interface between conductive cap 46 and dielectric layer 52, which may help to reduce cracking of surrounding metal connections and increase reliability of the package, particularly during thermal cycling. In some embodiments, the metal density of conductive cap 46 may be about 50 to 70 percent of the density of the conductive cap 46 if it were formed without any holes 56.

In some embodiments, holes 56 are located from about 5 μm to about 30 μm from each other and about 5 μm to about 10 μm from the edge of conductive cap 46. It may be desirable for section 60 to have as many holes 56 as possible given design limits. Holes 56 may be formed using the same materials and procedures discussed above. For example, after dielectric layer 50 is deposited and patterned, another mask layer may be deposited and patterned in such a way that, after an electroplating is done and the mask layer is removed, holes 56 are formed in conductive caps 46 due to removal of the mask layer.

Figure 12:
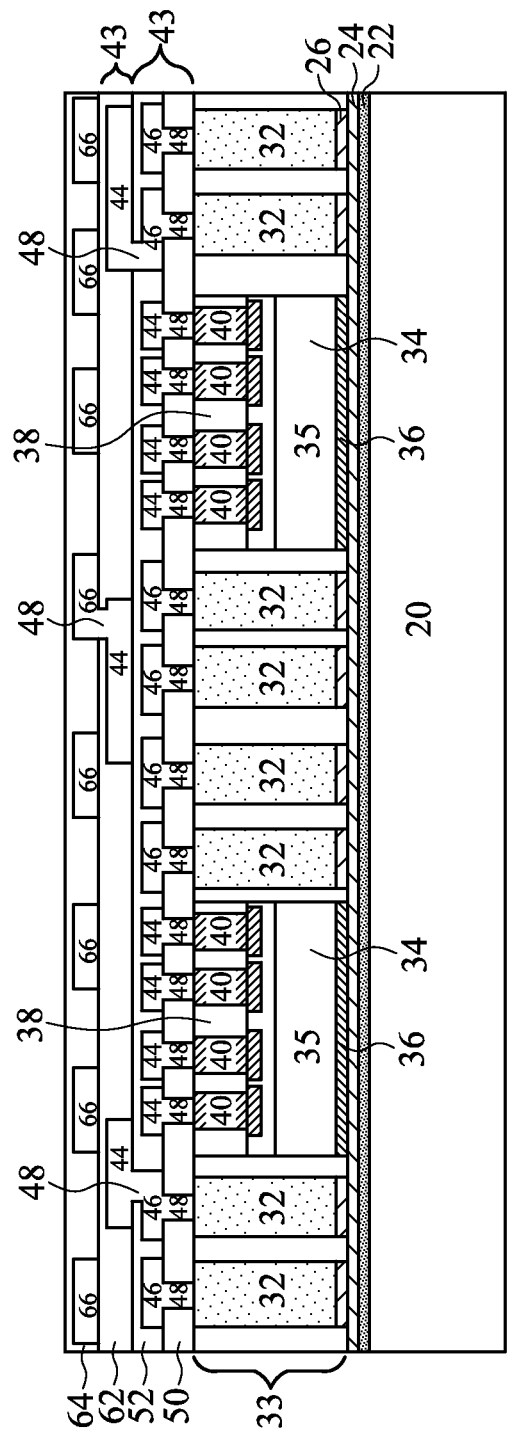
FIGS. 12 through 15 are cross-sectional views of intermediate stages in the manufacturing of a TV package in accordance with some exemplary embodiments.

Referring to FIG. 12, in some embodiments, additional RDLs 43 may be formed. The additional RDLs may be formed using similar processes and materials as described above with reference to other RDLs. FIG. 12 illustrates two layers of RDLs, while there may be one or more than two layers of RDLs 43, depending on the routing requirement of the respective package.

Figure 13:
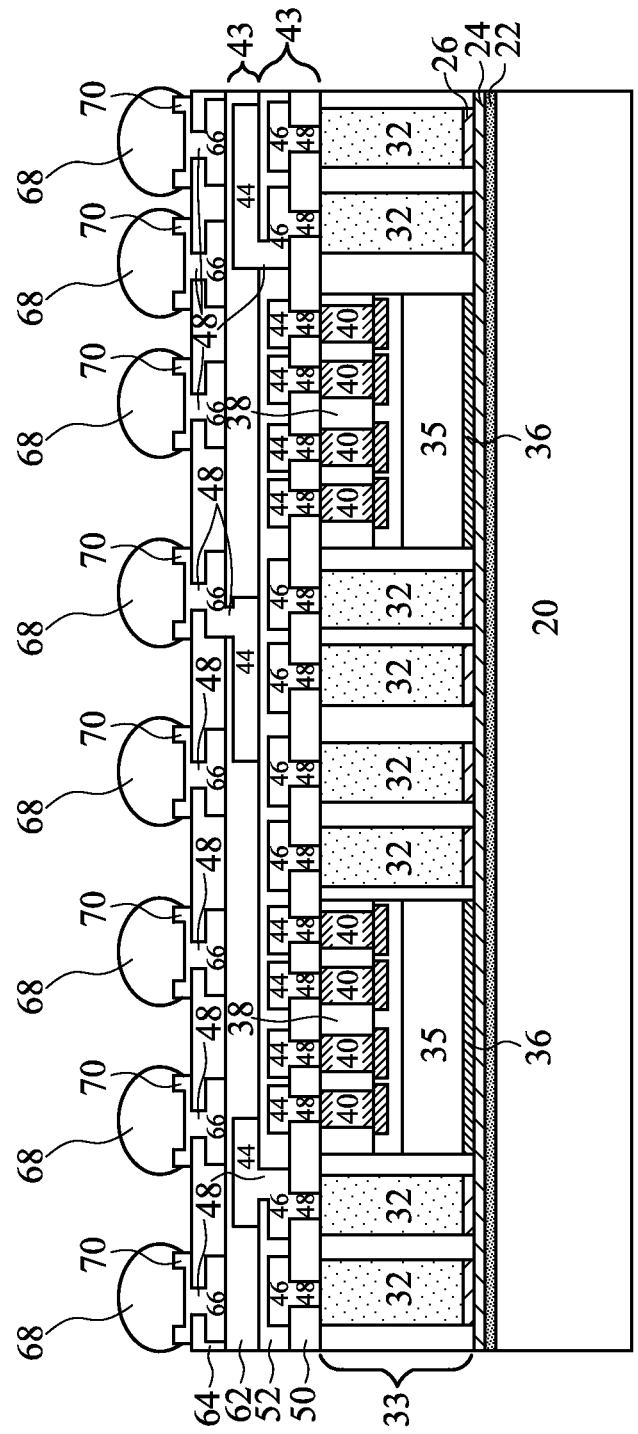

FIG. 13 illustrates an under bump metallization (UBM) 70 formed and patterned over an uppermost metallization pattern in accordance with some embodiments, thereby forming an electrical connection with an uppermost metallization layer, e.g., the contact pads 66 in the embodiment illustrated in FIG. 13. The UBM 70 may include a via 48 as illustrated in FIG. 13. The UBM 70 provides an electrical connection upon which an electrical connector, e.g., a solder ball/bump, a conductive pillar, or the like, may be placed. In an embodiment, the under bump metallization 70 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 70 is formed using sputtering. In other embodiments, electro plating may be used.

Connectors 68 are formed over the under bump metallization 70 in accordance with some embodiments. The connectors 68 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 68 may include a conductive material such as solder, copper, aluminum, gold, nickel, silver, palladium, tin, the like, or a combination thereof. In some embodiments, the connectors 68 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 68 may form a grid, such as a ball grid array (BGA). In some embodiments, a reflow process may be performed, giving the connectors 68 a shape of a partial sphere in some embodiments. Alternatively, the connectors 68 may comprise other shapes. The connectors 68 may also comprise non-spherical conductive connectors, for example.

In some embodiments, the connectors 68 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Figure 14:
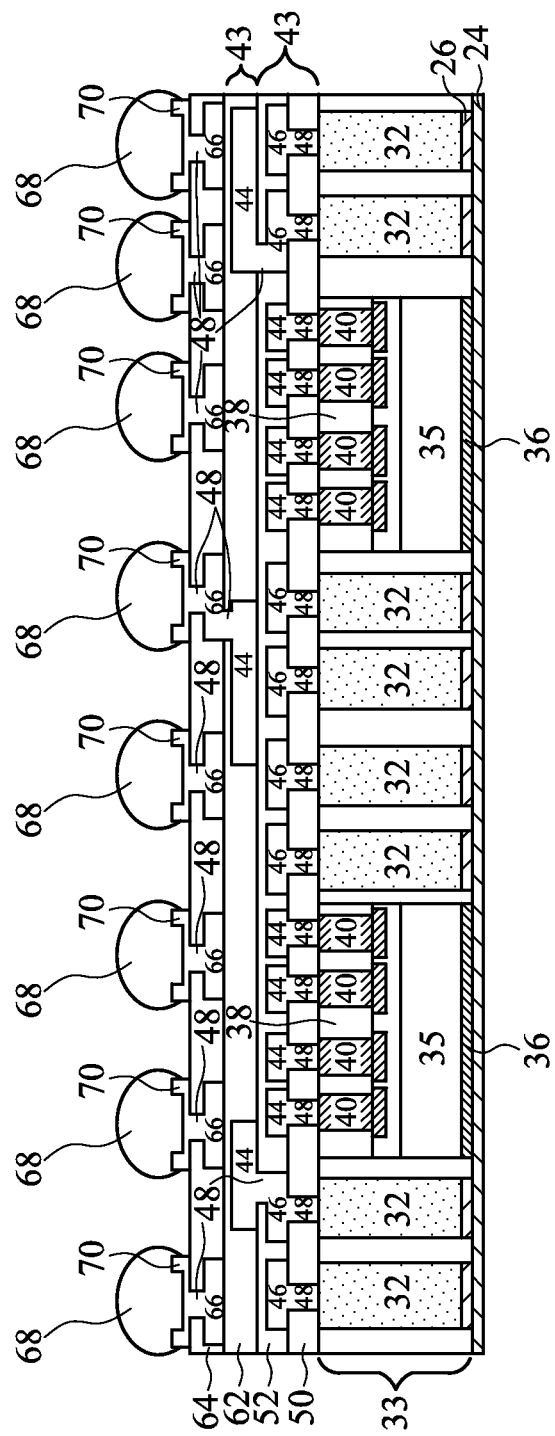
Figure 15:
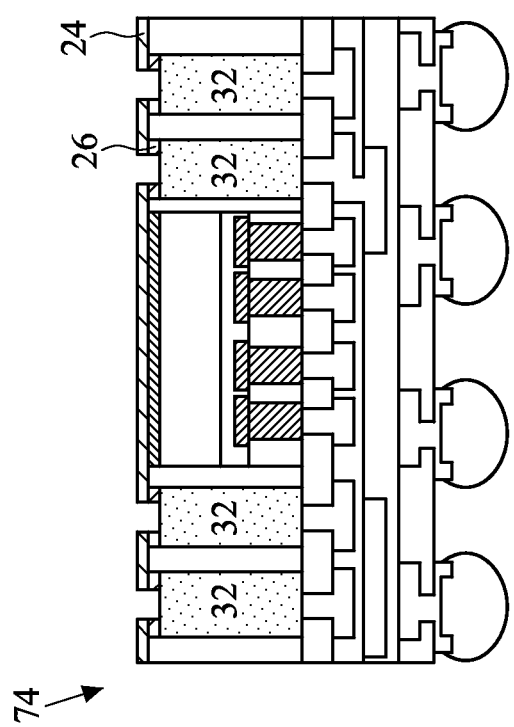

Next, carrier substrate 20 is de-bonded from the package. Release layer 22 is also cleaned from the package. The resulting structure is shown in FIG. 14. As a result of the removal of release layer 22, buffer layer 24 is exposed. Next, referring to FIG. 15, a laser drilling and an etch step are performed to expose metal features 32 through buffer layer 24 and the remaining portions of seed layer 26. A laser drilling process exposes the metal features 32. An etch step is performed in the openings to remove exposed portions of buffer layer 24 and seed layer 26. The etch step may be done using an acceptable etching process, such as by wet or dry etching. Next, the package is sawed into a plurality of packages 74. The resulting package is shown in FIG. 15.

Figure 16:
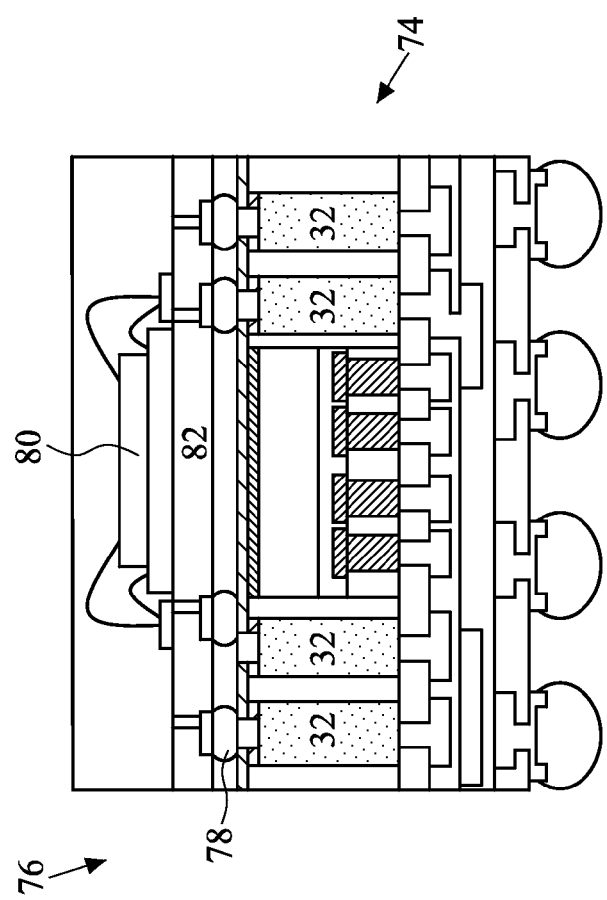
FIG. 16 illustrates the bonding of a TV package with a top package.

FIG. 16 illustrates the bonding of top package 76 to TV package 74, wherein the bonding may be through solder regions 78. In some embodiments, top package 76 includes dies 80 bonded to package substrate 82. Dies 80 may include a memory die(s), which may be, for example, a Static Random Access Memory (SRAM) die, a Dynamic Random Access Memory (DRAM) die, or the like.

Figure 17:
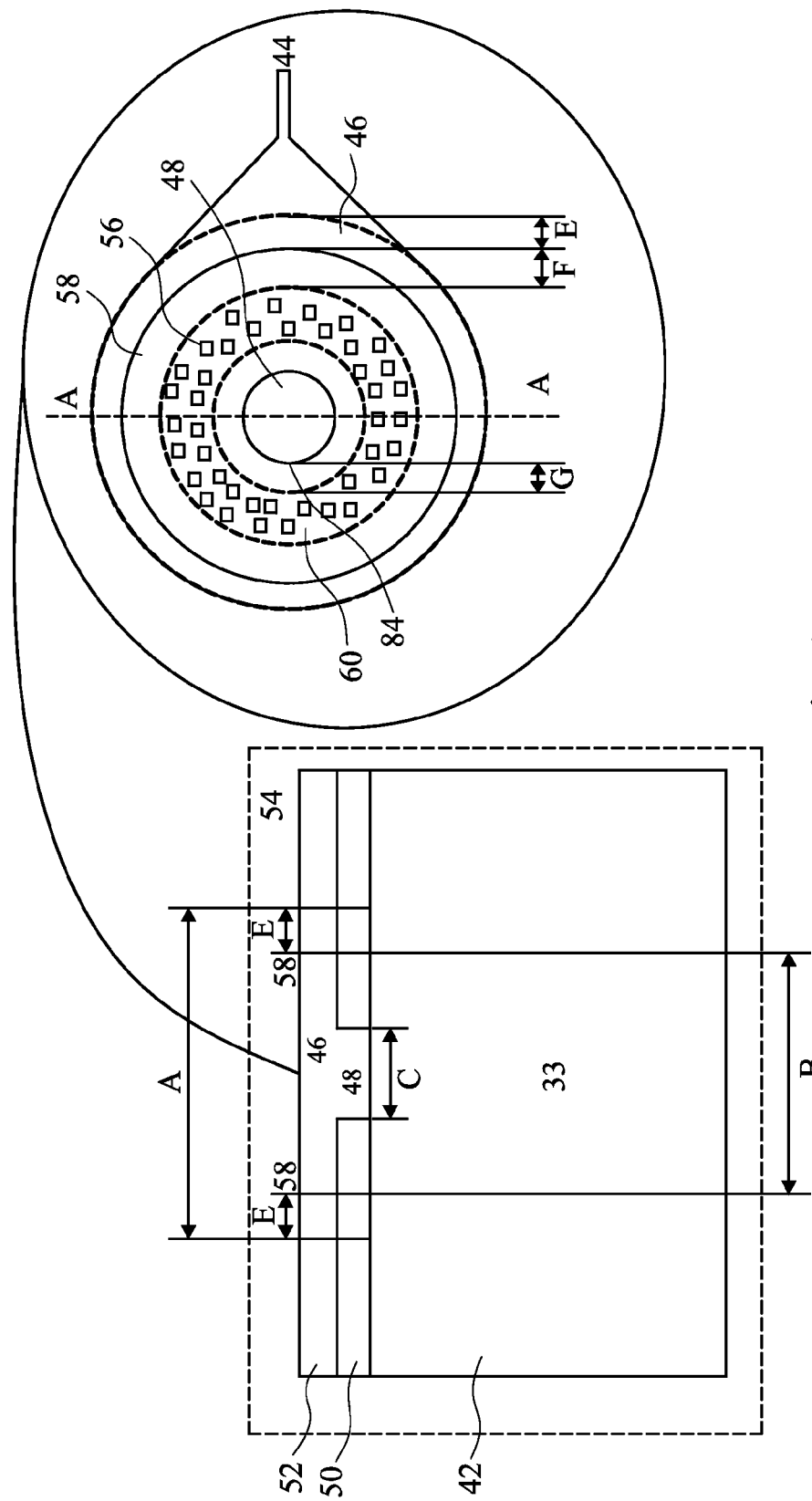
FIGS. 17 and 18 illustrate conductive caps formed over a TV in accordance with exemplary embodiments.

Other embodiments of the invention described herein are possible. FIG. 17 depicts an enlarged cross section and a corresponding plan view of conductive cap 46 in accordance with some embodiments of the invention. As discussed above, the conductive cap 46 is formed such that a metal density of the cap is reduced, which may help to reduce stresses on the interface between the conductive cap 46 and the dielectric layer 52 in which the conductive cap 46 is disposed, thereby increasing reliability of the package. Accordingly, conductive cap 46 is formed with a section 60 (outlined by dotted lines in the plan view of conductive cap 46 of FIG. 11), containing a plurality of holes in the section 60, resulting in a lower metal density of the conductive cap 46 compared to the density the cap would have had if it had been formed without the plurality of holes.

FIG. 17 depicts conductive cap 46 of some embodiments, formed in dielectric layer 52 and disposed over TV 33. Conductive cap 46 is coupled to TV 33 through via connection 48, which is formed in dielectric layer 50 and also disposed over TV 33. In some embodiments, conductive cap 46 has a width A that is greater than the width B of TV 33. In some embodiments, width A is about 10 μm to about 50 μm greater than width B, and width B is between about 100 μm to about 300 μm. The conductive cap extends a distance E beyond the perimeter 58 of TV 33. In some embodiments, distance E is about 5 μm to about 25 μm. Via connection 48 has a width C which is between about 10 μm to about 150 μm. In accordance with some embodiments, via connection 48 may be merged with conductive cap 46 and there may or may not be a distinguishable interface between conductive cap 46 and via connection 48.

In some embodiments, conductive cap 46 has a section 60 that forms a ring disposed between the perimeter 58 of TV 33 and the perimeter 84 of via connection 48. Section 60 has a plurality of holes 56, about 10 μm to about 50 μm in width, which may be formed using methods described earlier. Holes 56 result in a lower metal density of the conductive cap. In some embodiments, the inner edge of section 60 is located a distance G from the outer edge of via connection 48. In some embodiments, G is between about 10 μm to about 15 μm. The outer edge of section 60 is located a distance F from the outer perimeter 58 of TV 33. In some embodiments, F is between about 5 μm to about 25 μm. As described above in connection with other embodiments, holes 56 are located about 5 μm to about 30 μm from each other. It may be advantageous to locate as many holes 56 as possible in section 60, given design limitations. In some embodiments, the metal density of conductive cap 46 may be about 50 to 70 percent of the metal density that the cap would have had without the plurality of holes 56.

Although FIG. 11 and FIG. 17 depict different embodiments of conductive cap 46, it is possible and may be advantageous to combine both embodiments in a single conductive cap 46 with a plurality of sections 60 each containing a plurality of holes 56.

Figure 18:
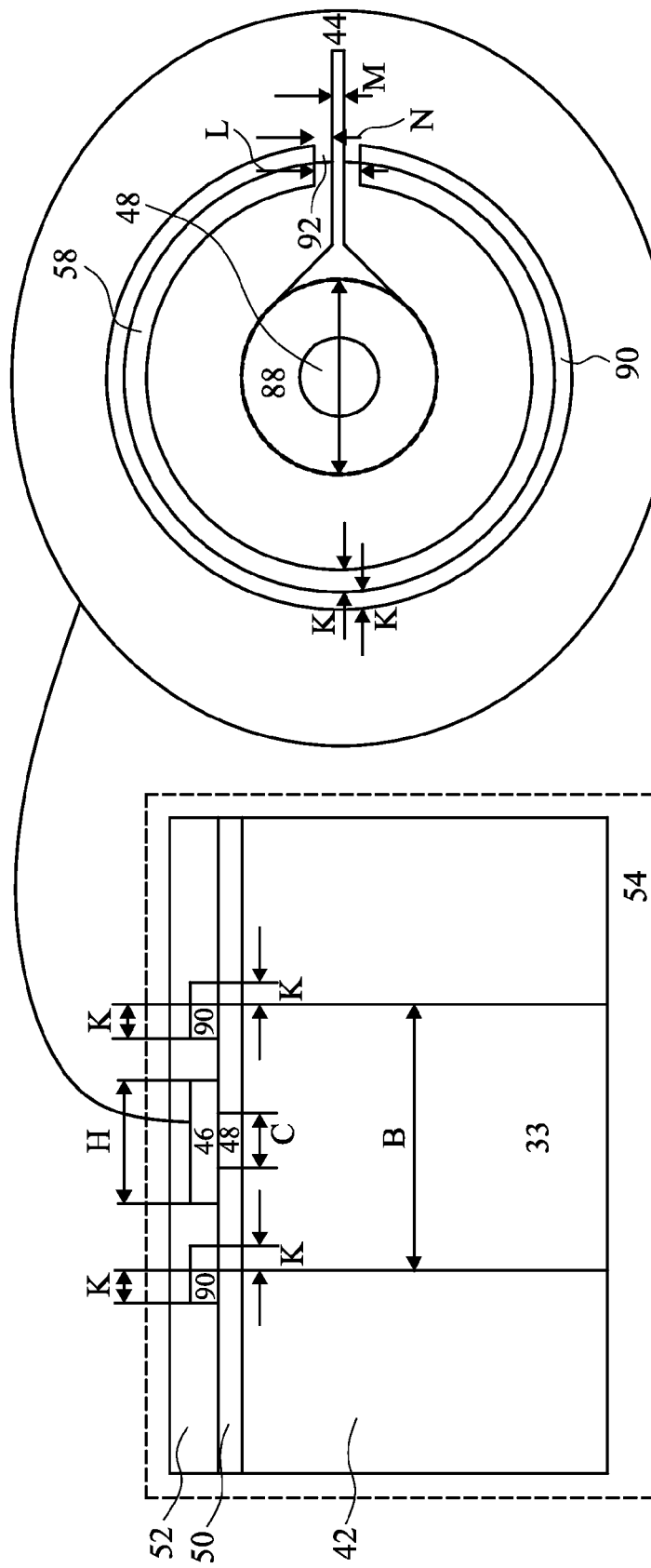

FIG. 18 depicts an enlarged cross section and a corresponding plan view of conductive cap 46 of some embodiments of conductive cap 46. As discussed above, the cap is formed such that a metal density of the cap is reduced, which may help to reduce stresses on the interfaces between the conductive cap 46 and the dielectric layer 52 in which the conductive cap 46 is disposed, thereby increasing reliability of the package. Accordingly, conductive cap 46 is formed in two pieces, a center piece 88 and a perimeter piece 90 which are physically separate from each other. It is believed that the physical separation between the center piece 88 and the perimeter piece 90 reduces the stresses between the interface of conductive cap 46 and the dielectric layer in which it is disposed, which may help to reduce cracking of surrounding metal connections and increase reliability of the package, particularly during thermal cycling.

As shown in FIG. 18, conductive cap 46 is formed in dielectric layer 52. Center piece 88 is disposed over TV 33 and electrically coupled to TV 33 through via connection 48, which is formed in dielectric layer 50 and is also disposed over TV 33. In some embodiments, TV 33 has a width B, which is between about 100 μm to about 250 μm. Via connection 48 has a width C, which is between about 10 μm to about 50 μm. Center piece 88 has a width H, which in some embodiments is between about 70 μm to about 100 μm. In accordance with some embodiments, via connection 48 may be merged with center piece 88 and there may or may not be a distinguishable interface between center piece 88 and via connection 48.

Perimeter piece 90 forms a ring disposed over the perimeter of TV 33 with opening 92 in one side of the ring. Perimeter piece 90 extends a distance K on either side of perimeter 58 TV 33. Opening 92 has a width L of about 15 μm to about 70 μm and may be about 30 μm. Center piece 88 is connected to conductive line 44, which in some embodiments extends through the opening 92 of perimeter piece 90 for connection to center piece 88. In some embodiments, conductive line 44 has a width M between about 5 μm to about 40 μm. Conductive line 44 is spaced a distance N from each side of perimeter piece 90 when passing through opening 92. Distance N is between about 5 μm to about 15 μm in some embodiments.

In some embodiments, center piece 88 may be used for signals and perimeter piece 90 may be connected to ground. In some embodiments, conductive caps 46 as depicted in FIGS. 11 and 17 may be used for connections to power sources or ground sources, while conductive caps 46 depicted in FIG. 18 may be used for signal connection. Other alternative uses for each embodiment are possible.

Figure 19:
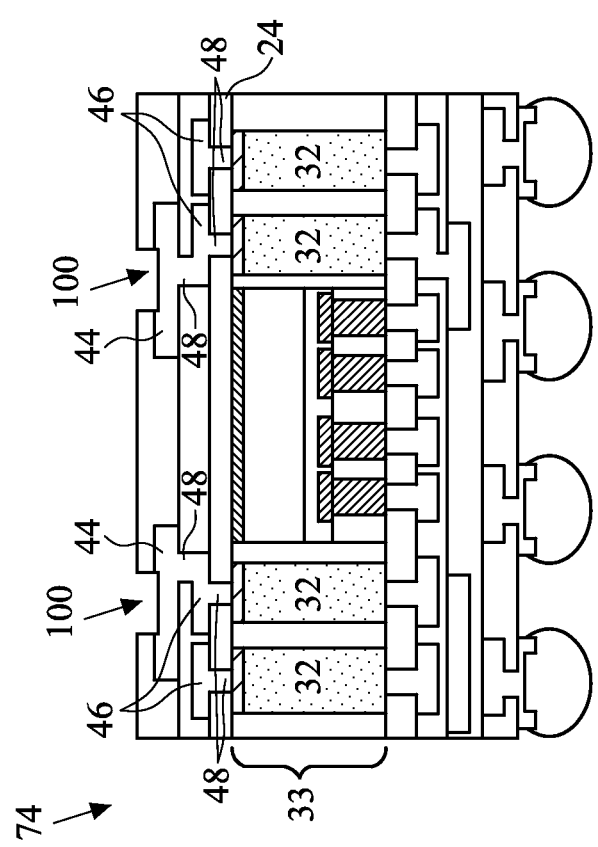
FIG. 19 is a cross-sectional view of an intermediate stage in the manufacturing of a TV package in accordance with an exemplary embodiment.

FIG. 19 depicts an embodiment of package 74. In some embodiments, via connections 48, conductive caps 46, and RDLs 43 are formed on both sides of TVs 33. To create this embodiment, after carrier substrate 20 is de-bonded (shown in FIG. 14), conductive caps 46, RDLs 43 and via connections 48 are formed on the other side of TVs 33 using the same methods described earlier. Additional dielectric layers and RDLs may be formed as needed for the particular circuit design. In some embodiments, the backside RDLs may be formed using similar processes and materials as discussed above on the carrier substrate 20 prior to forming TVs 33. Openings 100 may be created in the uppermost dielectric layer for electrical connection to a top layer of RDL, using any suitable laser drilling and etching process described earlier.

In some embodiments, a method of manufacturing a semiconductor device is provided. The method includes forming a through via on a substrate, the through via extending through a molding compound. A via connection is formed, disposed over and contacting the through via. A cap is then formed, disposed over and contacting the via connection, such that a width of the cap is greater than a width of the through via and a plurality of holes are formed in a first section of the cap.

In some embodiments, a method of manufacturing a semiconductor device is provided. The method includes forming a through via on a substrate, the through via extending through a molding compound. A via connection is formed, disposed over and contacting the through via. A cap is formed over the through via, including a perimeter piece and a center piece. The perimeter piece is electrically disconnected from the center piece. The center piece is disposed over and contacts the via connection.

In some embodiments, a semiconductor device is provided. The semiconductor device includes a through via extending through a molding compound. A via connection is disposed over the through via. A cap is also disposed over the through via, and contacts the via connection, wherein a width of the cap is greater than a width of the through via. A plurality of holes are formed in a first section of the cap.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor device, the method comprising:
    forming a through via on a substrate, the through via extending through a molding compound;
    forming a via connection disposed over and contacting the through via; and
    forming a cap disposed over the through via and contacting the via connection, wherein a width of the cap is greater than a width of the through via, a line extends from a first portion of a perimeter of the cap, through a center point of the cap, to a second portion of the perimeter of the cap, the first portion being opposite to the second portion, the line extending a first distance from the center point of the cap to the first portion of the perimeter of the cap, the line extending a second distance from the center point of the cap to the second portion of the perimeter of the cap, the first distance and the second distance being the same, the center point of the cap overlying a center point of the through via, wherein a plurality of holes are formed in a first section of the cap, wherein a first hole of the plurality of holes comprises a perimeter, and a portion of the perimeter of the first hole that is closest to the via connection is laterally positioned between a perimeter of the through via and the first portion of the perimeter of the cap.

2. The method of claim 1, wherein the first section forms a ring disposed over the perimeter of the through via in a plan view.

3. The method of claim 2, wherein the first section extends at least 5 μm on either side of the perimeter of the through via.

4. The method of claim 1, wherein a metal density of the cap is 50 to 70 percent of a metal density that the cap would have had without the plurality of holes.

5. The method of claim 1, further comprising:
    placing a die over the substrate;
    forming a molding compound over the die;
    planarizing the molding compound to expose a metal pillar of the die; and
    forming one or more redistribution layers overlying the molding compound and electrically coupled to the cap and the metal pillar.

6. The method of claim 1, wherein the via connection has a width between 10 μm to 150 μm.

7. The method of claim 1, wherein the holes have a width of 10 μm to 50 μm.

8. The method according to claim 1, wherein the first hole exposes a dielectric layer that extends along sidewalls of the via connection.

9. The method according to claim 1, wherein a second hole of the plurality of holes comprises a perimeter, and the perimeter of the second hole is laterally positioned between the perimeter of the through via and a perimeter of the via connection.

10. A semiconductor device comprising:
    a through via extending through a molding compound;
    a via connection disposed over the through via; and
    a cap disposed over the through via and contacting the via connection, wherein a width of the cap is greater than a width of the through via, and wherein a plurality of holes are formed in a first section of the cap, wherein a first hole of the plurality of holes comprises a perimeter, a first portion and a second portion of the perimeter of the first hole are laterally positioned between a perimeter of the through via and a perimeter of the via connection, the first portion being a portion of the perimeter that is closest to the via connection, the second portion being a portion of the perimeter that is farthest from the via connection.

11. The semiconductor device of claim 10, further comprising:
    a plurality of redistribution layers over the molding compound; and
    a second semiconductor device bonded to the redistribution layers.

12. The semiconductor device of claim 10, further comprising:
    a die, the molding compound extending along sidewalls of the die; and
    one or more redistribution layers overlying the molding compound and the die.

13. The semiconductor device of claim 10, wherein the first section forms a ring disposed between the perimeter of the through via and the perimeter of the via connection in a plan view.

14. The semiconductor device of claim 10, wherein the perimeter of the first hole is disposed over a dielectric layer, the via connection extending through the dielectric layer.

15. A method, comprising:
    forming a through via on a substrate;
    placing a die on the substrate;
    encapsulating sidewalls of the through via and the die with a molding material;
    forming a dielectric layer over the molding material;
    forming a via connection in the dielectric layer, the via connection contacting the through via; and
    forming a conductive cap over the via connection, wherein a plurality of holes are formed in the conductive cap, the holes overlying the dielectric layer, and wherein the conductive cap includes a perimeter, a first portion of the perimeter of the conductive cap is opposite to a second portion of the perimeter of the conductive cap, a first line that extends from the first portion of the perimeter of the conductive cap to the substrate extends through the molding material, a second line that extends from the second portion of the perimeter of the conductive cap to the substrate extends through the molding material, and the first line and the second line are perpendicular to a surface of the molding material, and wherein a center point of the conductive cap overlies a center point of the via connection, the center point of the conductive cap is between the first portion of the perimeter and the second portion of the perimeter, the first portion of the perimeter is a first distance from the center point of the conductive cap, the second portion is a second distance from the center point of the conductive cap, and the first distance and the second distance are the same, and wherein a hole of the plurality of holes is disposed between the first portion of the perimeter of the conductive cap and a perimeter of the via connection.

16. The method of claim 15, wherein the holes are formed in a first section of the conductive cap, and the first section has an annular shape.

17. The method of claim 16, wherein the first section is disposed over a perimeter of the through via.

18. The method of claim 16, wherein the first section is disposed over the dielectric layer between a perimeter of the through via and a perimeter of the via connection.

19. The method of claim 18, wherein the first section is offset in a plan view from the perimeter of the through via and the perimeter of the via connection.

20. The method of claim 15, wherein the through via and the conductive cap have circular shapes in a plan view.

* * * * *